United States Patent [19]

Wu et al.

[11] Patent Number: 5,252,551
[45] Date of Patent: Oct. 12, 1993

[54] SUPERCONDUCTING COMPOSITE WITH MULTILAYER PATTERNS AND MULTIPLE BUFFER LAYERS

[75] Inventors: Xin D. Wu, Greenbelt, Md.; Ross E. Muenchausen, Espanola, N. Mex.

[73] Assignee: The United States of America as represented by the Department of Energy, Washington, D.C.

[21] Appl. No.: 814,355

[22] Filed: Dec. 27, 1991

[51] Int. Cl.$^5$ .............................................. B32B 9/00
[52] U.S. Cl. ..................................... 505/1; 505/701; 505/702; 505/703; 428/209; 428/688; 428/689; 257/33
[58] Field of Search .......................... 505/1, 701–704; 428/688, 930, 688.1, 901

[56] References Cited

U.S. PATENT DOCUMENTS

| | | | |
|---|---|---|---|
| 4,900,709 | 2/1990 | Heijman | 505/1 |
| 4,983,575 | 1/1991 | Komuro | 428/688 |
| 5,073,537 | 12/1991 | Hung | 505/1 |
| 5,084,438 | 1/1992 | Matsubara | 428/901 |
| 5,087,605 | 2/1992 | Hegde et al. | 505/1 |
| 5,126,315 | 6/1992 | Nishino | 505/703 |

OTHER PUBLICATIONS

T. Inoue et al., "Epitaxial Growth of CeO$_2$ Layers on Silicon," Applied Physics Letters 56 (14), 1332–1333, Apr. 2, 1990.

H. Nagata et al., "Heteroepitaxial Growth of CeO$_2$ (001) Films on Si (001) Substrates by Pulsed Laser Deposition in Ultrahigh Vacuum," Japanese Journal of Applied Physics, 30 (6B), L1136–L1138, Jun. 1991.

C. T. Rogers et al., "Fabrication of Heteroepitaxial YBa$_2$Cu$_3$O$_{7-x}$–PrBa$_2$Cu$_3$O$_{7-x}$–YBa$_2$Cu$_3$O$_{7-x}$ Josephson Devices Grown by Laser Deposition," Applied Physics Letters 55 (19), 2032–2033, Nov. 6, 1990.

J. J. Kingston et al., "Multilayer YBa$_2$Cu$_3$O$_x$–SrTiO$_3$–YBa$_2$Cu$_3$O$_x$ Films for Insulating Crossovers," Applied Physics Letters 56 (2), 189–191, Jan. 8, 1990.

A. B. Berezin et al., "Y$_1$Ba$_2$Cu$_3$O$_{7-x}$ Thin Films Grown on Sapphire with Epitaxial MgO Buffer Layers," Applied Physics Letters 57 (1), 90–92, Jul. 2, 1990.

D. K. Fork et al., "High Critical Currents in Strained Epitaxial YBa$_2$Cu$_3$O$_{7-d}$ on Si," Applied Physics Letters 57 (11), 1161–1163, Sep. 10, 1990.

(List continued on next page.)

*Primary Examiner*—Patrick J. Ryan
*Assistant Examiner*—Patrick R. Jewik
*Attorney, Agent, or Firm*—Bruce H. Cottrell; Paul D. Gaetjens; William R. Moser

[57] ABSTRACT

An article of manufacture including a substrate, a patterned interlayer of a material selected from the group consisting of magnesium oxide, barium-titanium oxide or barium-zirconium oxide, the patterned interlayer material overcoated with a secondary interlayer material of yttria-stabilized zirconia or magnesium-aluminum oxide, upon the surface of the substrate whereby an intermediate article with an exposed surface of both the overcoated patterned interlayer and the substrate is formed, a coating of a buffer layer selected from the group consisting of cerium oxide, yttrium oxide, curium oxide, dysprosium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, yttrium oxide and ytterbium oxide over the entire exposed surface of the intermediate article, and, a ceramic superconductive material layer as an overcoat upon the buffer layer whereby the ceramic superconductive material situated directly above the substrate has a crystal structure substantially different than the ceramic superconductive material situated above the overcoated patterned interlayer.

5 Claims, 5 Drawing Sheets

OTHER PUBLICATIONS

X. D. Wu et al., "Epitaxial Yttria-Stabilized Zirconia on (1101) Sapphire for $YB_2Cu_3O_{7-d}$ Thin Films," Applied Physics Letters 58 (3), 304–306, Jan. 21, 1991.

H. Myoren et al., "Crystalline Qualities and Critical Current Densities of As-Grown $Ba_2YCu_3O_x$ Thin Films on Silicon with Buffer Layers," Japanese Journal of Applied Physics, vol. 29, No. 6, L955–L957, Jun. 1990.

M. Yoshimoto et al., "In Situ RHEED Observation of $CeO_2$ Film Growth on Si by Laser Ablation Deposition in Ultrahigh-Vacuum," Japanese Journal of Applied Physics, vol. 29, No. 7, L1199–L1202, Jul. 1990.

X. D. Wu et al., "Epitaxial $CeO_2$ Films as Buffer Layers for High-Temperature Superconducting Thin Films," Applied Physics Letters 58, (19) 2165–2167, May 13.

K. M. Beauchamp et al., "Barrier Technology for Dysprosium Barium Copper Oxide ($DyBa_2Cu_3O_{7-x}$) Junctions and Related Structures," Chem. Abst. 114, (20): 197437Z.

SUPERCONDUCTING COMPOSITE WITH MULTILAYER PATTERNS AND MULTIPLE BUFFER LAYERS

FIELD OF THE INVENTION

The present invention relates to the field of superconducting articles having two distinct regions of superconductive material with differing in-plane orientations whereby the conductivity across the boundary between the two regions can be tailored. This invention is the result of a contract with the Department of Energy (Contract No. W-7405-ENG-36).

BACKGROUND OF THE INVENTION

Layers of epitaxial cerium oxide have been found to be excellent buffer or intermediate layers for high temperature superconducting thin films as described by Wu et al. in Appl. Phys. Lett. 58 (19), 2165 (1991). Other related metal oxides have since been found to behave in a similar fashion to the cerium oxide. An interesting result of the use of these metal oxide buffer layers is that the crystal structure of the metal oxide buffer layer can match the crystal structure of the underlying substrate or can have a crystal structure rotated by 45° from the basal plane with respect to the crystal structure of the underlying substrate depending upon the particular material selected as the underlying material.

Others have taken advantage of this crystal structure effect to form junction devices such as superconducting quantum interference devices (SQUIDs) wherein such a device includes a base substrate of strontium-titanium oxide, a patterned interlayer of magnesium oxide upon the surface of the substrate whereby an intermediate article with an exposed surface of both the patterned interlayer of magnesium oxide and the base substrate is formed, a coating of cerium oxide as a buffer layer over the entire exposed surface of the intermediate article, and, a ceramic superconductive material layer as an overcoat upon the buffer layer whereby the ceramic superconductive material situated directly above the substrate without the underlying patterned interlayer has an in-plane orientation of crystal structure different than the ceramic superconductive material situated directly above the patterned magnesium oxide interlayer. Unfortunately, when cerium oxide is directly deposited upon magnesium oxide, the result is a mixture of in-plane orientations thereby diminishing the junction performance. Also, magnesium oxide is very hygroscopic making manufacture more difficult.

Accordingly, an object of this invention is to provide a superconductive article such as a junction device having both a first region and a second region, said first and second regions each having an in-plane orientation of crystal structure distinct from the other region, said article eliminating the direct contact between magnesium oxide and a cerium oxide buffer layer of the prior art.

SUMMARY OF THE INVENTION

To achieve the foregoing and other objects, and in accordance with the purposes of the present invention, as embodied and broadly described herein, the present invention provides an article of manufacture comprising a substrate, a patterned interlayer of a material selected from the group consisting of magnesium oxide, barium-zirconium oxide or barium-titanium oxide upon the surface of the substrate thereby characterizable as an intermediate article having exposed surfaces of both the patterned interlayer and the substrate, the patterned interlayer material overcoated with a secondary interlayer material of yttria-stabilized zirconia or magnesium-aluminum oxide upon the surface of the patterned interlayer thereby characterizable as a second intermediate article with an exposed surface of both the overcoated secondary interlayer material and the substrate, a coating of a buffer layer selected from the group consisting of cerium oxide, yttrium oxide, curium oxide, dysprosium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, yttrium oxide and ytterbium oxide over at least the entire exposed surface of the secondary interlayer material, and, a ceramic superconductive material layer as an overcoat upon the buffer layer whereby the ceramic superconductive material situated directly above the substrate without the underlying patterned overlayer has an in-plane orientation of crystal structure substantially different than the ceramic superconductive material situated above the overcoated patterned interlayer.

In another embodiment, the present invention provides an article of manufacture comprising a substrate of magnesium oxide, a patterned interlayer of yttria-stabilized zirconia whereby an intermediate article with an exposed surface of both the patterned interlayer and the substrate is formed, and, a ceramic superconductive material layer as an overcoat upon the intermediate article whereby the ceramic superconductive material situated directly above the magnesium oxide substrate without the underlying patterned interlayer has an in-plane orientation of crystal structure substantially different than the ceramic superconductive material situated above the patterned interlayer of yttria-stabilized zirconia.

DETAILED DESCRIPTION

Figure 1:
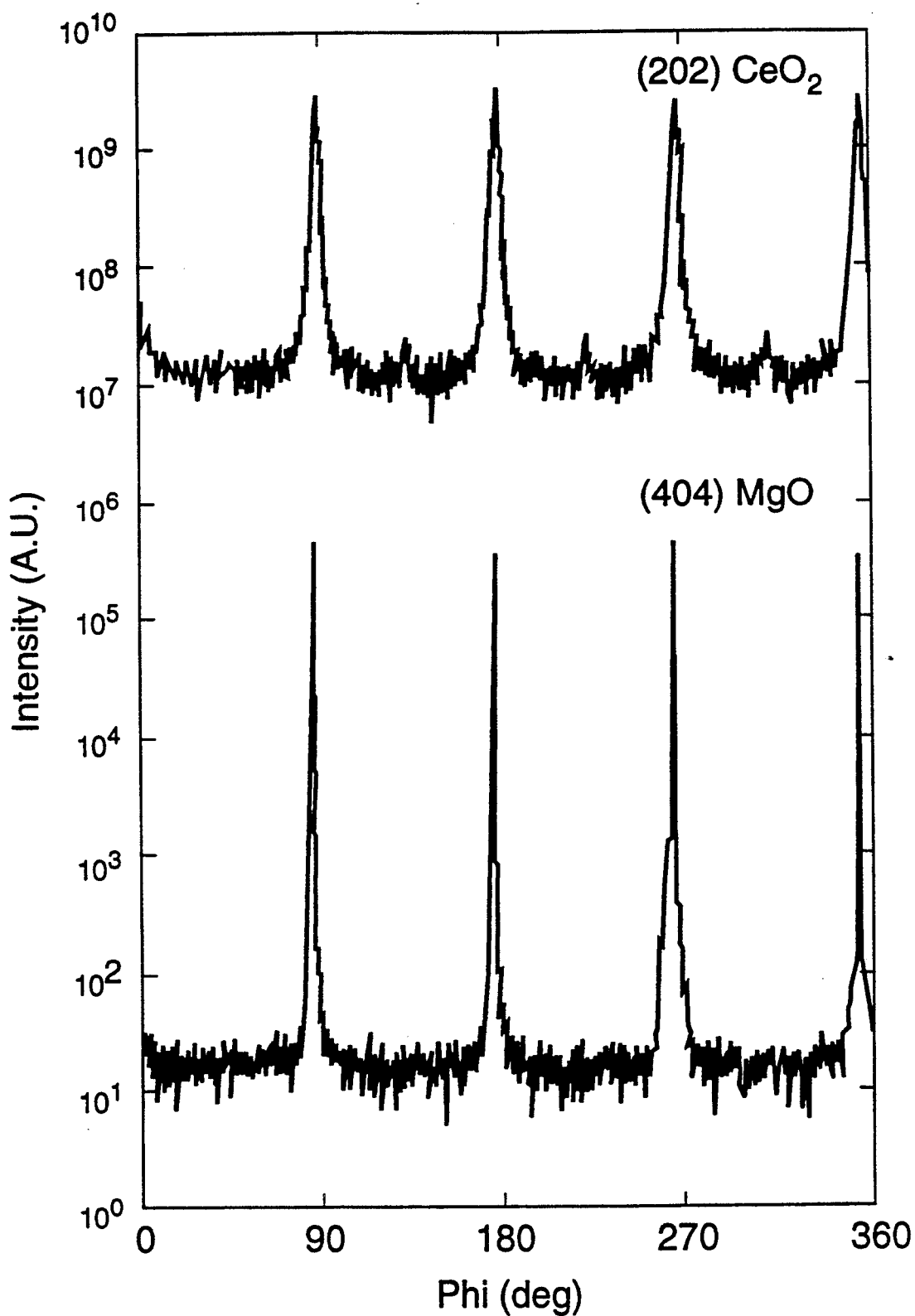
FIG. 1 is a graph of phi scan data from an x-ray pole figure scan of a sample of cerium oxide upon magnesium oxide similar to the prior art.

The present invention concerns an article of manufacture, e.g., a junction device, wherein different regions of a high temperature ceramic superconductive material layer have substantially different in-plane orientation of crystal structure whereby the conducting properties of the superconductive material are selectively controllable within the different regions. The present invention can overcome limitations of the prior art structure by either using a layer of barium-titanium oxide or barium-zirconium oxide in place of the previous magnesium oxide layer and/or by using an interlayer between the cerium oxide or cerium oxide-type layer and either the magnesium oxide, the barium-titanium oxide, or the barium-zirconium oxide.

In one embodiment of the invention, a base substrate of, e.g., strontium-titanium oxide can be coated with a patterned layer of an interlayer material, e.g., magnesium oxide, barium-zirconium oxide, or barium-titanium oxide, thereby forming an intermediate article having exposed surfaces of both the strontium-titanium oxide and the magnesium oxide, the barium-zirconium oxide, or the barium-titanium oxide. Upon the patterned interlayer, a secondary interlayer material of yttria-stabilized zirconia or magnesium-aluminum oxide is then coated forming a second intermediate article having exposed surfaces of both the strontium-titanium oxide and the yttria-stabilized zirconia or magnesium-aluminum oxide. Onto this second intermediate article, a layer of buffer material, e.g., cerium oxide, can be coated. Finally, a layer of a superconductive material, e.g., yttrium-barium-copper oxide ($YBa_2Cu_3O_{7-x}$) can be deposited. The result of the deposition of the superconductive material upon the buffer-layer coated second intermediate article is that the superconductive material overcoating the patterned interlayer material has an in-plane orientation of crystal structure substantially different than the superconductive material overcoating the substrate regions uncoated with the interlayer material.

By "substantially different" is meant that the crystal structures of the two regions of superconductive material have crystal alignments at essentially 45° to one another. As current flow in such superconductive materials follows the aligned crystal structure, current capacity would be limited across the boundary between the differing two regions of the superconductive material. Accordingly, this patterned article of manufacture can be used in applications such as junction devices such as, e.g., SQUIDs.

Materials suitable as the base substrate, i.e., the underlying substrate material, can include strontium-titanium oxide ($SrTiO_3$), yttria-stabilized zirconia (YSZ), lanthanum aluminum oxide ($LaAlO_3$), aluminum oxide (sapphire, either R-cut or M-cut), quartz, calcium-titanium oxide ($CaTiO_3$), and magnesium oxide (MgO).

Among the suitable superconductive materials are those superconductive materials having a critical transition temperature ($T_c$) of greater than about 20° Kelvin (K.). Among the materials with such a $T_c$ are included, e.g., yttrium-barium-copper oxide ($YBa_2Cu_3O_{7-x}$), bismuth-strontium-calcium-copper oxide, thallium-barium-calcium-copper oxide, neodymium-cerium-copper oxide and bismuth-potassium-barium oxide (BKBO).

The materials used as the buffer layer are both structurally and chemically compatible with an overcoat layer of a ceramic high temperature superconductive material. By "chemical compatibility" is meant that the buffer layer does not undergo property-degrading chemical interactions with the superconductive material. By "structural compatibility" is meant that the buffer layer has a substantially similar lattice structure with the superconductive material. Among the suitable buffer layer materials are included cerium oxide ($CeO_2$), curium oxide ($Cm_2O_3$), dysprosium oxide ($Dy_2O_3$), erbium oxide ($Er_2O_3$), europium oxide ($Eu_2O_3$), iron oxide (beta-$Fe_2O_3$), gadolinium oxide ($Gd_2O_3$), holmium oxide ($Ho_2O_3$), indium oxide ($In_2O_3$), lanthanum oxide ($La_2O_3$), manganese oxide (beta-$Mn_2O_3$), lutetium oxide ($Lu_2O_3$), neodymium oxide ($Nd_2O_3$), praseodymium oxide ($Pr_2O_3$), plutonium oxide ($Pu_2O_3$), samarium oxide ($Sm_2O_3$), terbium oxide ($Tb_2O_3$), thallium oxide ($Tl_2O_3$), thulium oxide ($Tm_2O_3$), yttrium oxide ($Y_2O_3$), and ytterbium oxide ($Yb_2O_3$). The preferred buffer layer materials include cerium oxide, gadolinium oxide, praseodymium oxide and dysprosium oxide.

The buffer layer can be deposited upon the intermediate article having an exposed surface of both the patterned interlayer and the substrate by, e.g., pulsed laser deposition or by methods such as evaporation including coevaporation, e-beam evaporation and activated reactive evaporation, sputtering including magnetron sputtering, ion beam sputtering or ion assisted sputtering, cathodic arc deposition, chemical vapor deposition (CVD), plasma enhanced chemical vapor deposition (PECVD), organometallic chemical vapor deposition (OMCVD), molecular beam epitaxy (MBE), a sol-gel process, and liquid phase epitaxy.

In a pulsed laser deposition, powder of the desired buffer material, e.g., cerium oxide, can be initially pressed into a disk or pellet under high pressure, generally above about 1000 pounds per square inch (PSI) and the pressed disk then sintered in an oxygen atmosphere at temperatures above 1000° C. for at least about 1 hour, preferably from about 12 to about 24 hours. An apparatus suitable for the pulsed laser deposition is shown in Appl. Phys. Lett. 56, 578 (1990), "Effects of beam parameters on excimer laser deposition of $YBa_2Cu_3O_{7-x}$", such description hereby incorporated by reference.

Suitable conditions for the pulsed laser deposition include, e.g., the laser, such as an excimer laser (20 nanoseconds (ns), 308 nanometers (nm)), targeted upon a rotating pellet of the buffer material at an incident angle of about 45°. The target substrate can be mounted upon a heated holder rotated at about 0.5 rpm to minimize thickness variations in the resultant film. The substrate can be heated during the deposition at temperatures from about 600° C. to about 950° C., preferably from about 700° C. to about 850° C. An oxygen atmosphere of about 0.1 millitorr (mTorr) to about 10 Torr, preferably from about 100 to about 250 mTorr, can be maintained within the deposition chamber during the deposition. Distance between the substrate holder and the pellet can be from about 4 centimeters (cm) to about 10 cm. In the case of sapphire as a substrate, the buffer layers may be deposited at oxygen pressures of about 350 mTorr and temperatures of about 900° C. to promote the formation of (100) oriented buffer layers.

The rate of the deposited film can be varied from about 0.1 angstrom per second (A/s) to about 200 A/s by changing the laser repetition rate from about 1 hertz (Hz) to about 200 Hz. As laser beam divergence is a function of the repetition rate, the beam profile is monitored after any change of repetition rate and the lens focal distance adjusted to maintain a constant laser energy density upon the target pellet. Generally, the laser beam can have dimensions of about 3 millimeters (mm) by 4 mm with an average energy density of about 1 to 2 joules per square centimeter ($J/cm^2$). After deposition, the films generally are cooled to 200° C. within an oxygen atmosphere of greater than about 100 Torr over about 15 to about 30 minutes.

In another embodiment, the present invention provides an article of manufacture comprising a substrate of magnesium oxide, a patterned interlayer of yttria-stabilized zirconia whereby an intermediate article with an exposed surface of both the patterned interlayer and the substrate is formed, and, a ceramic superconductive material layer as an overcoat upon the intermediate article whereby the ceramic superconductive material situated directly above the magnesium oxide substrate without the underlying patterned interlayer has an in-plane orientation of crystal structure substantially different than the ceramic superconductive material situated above the patterned interlayer of yttria-stabilized zirconia.

The present invention is more particularly described in the following examples which are intended as illustrative only, since numerous modifications and variations will be apparent to those skilled in the art.

The coatings of the intermediate layers and the superconductive material were characterized by x-ray diffraction, x-ray pole figure scan, Rutherford backscattering spectroscopy (RBS), and channeling using a goniometer with three axial rotations and two translations. The superconducting properties were measured by an inductive method and a direct transport method.

EXAMPLE A

An article corresponding to the prior art was prepared by depositing cerium oxide upon a magnesium oxide substrate by pulsed laser deposition. The resultant article was analyzed by x-ray pole figure scan and the results are shown in FIG. 1. These results indicated that a mixture of in-plane rotations were present within the cerium oxide layer upon the magnesium oxide.

EXAMPLE 1

Figure 2:
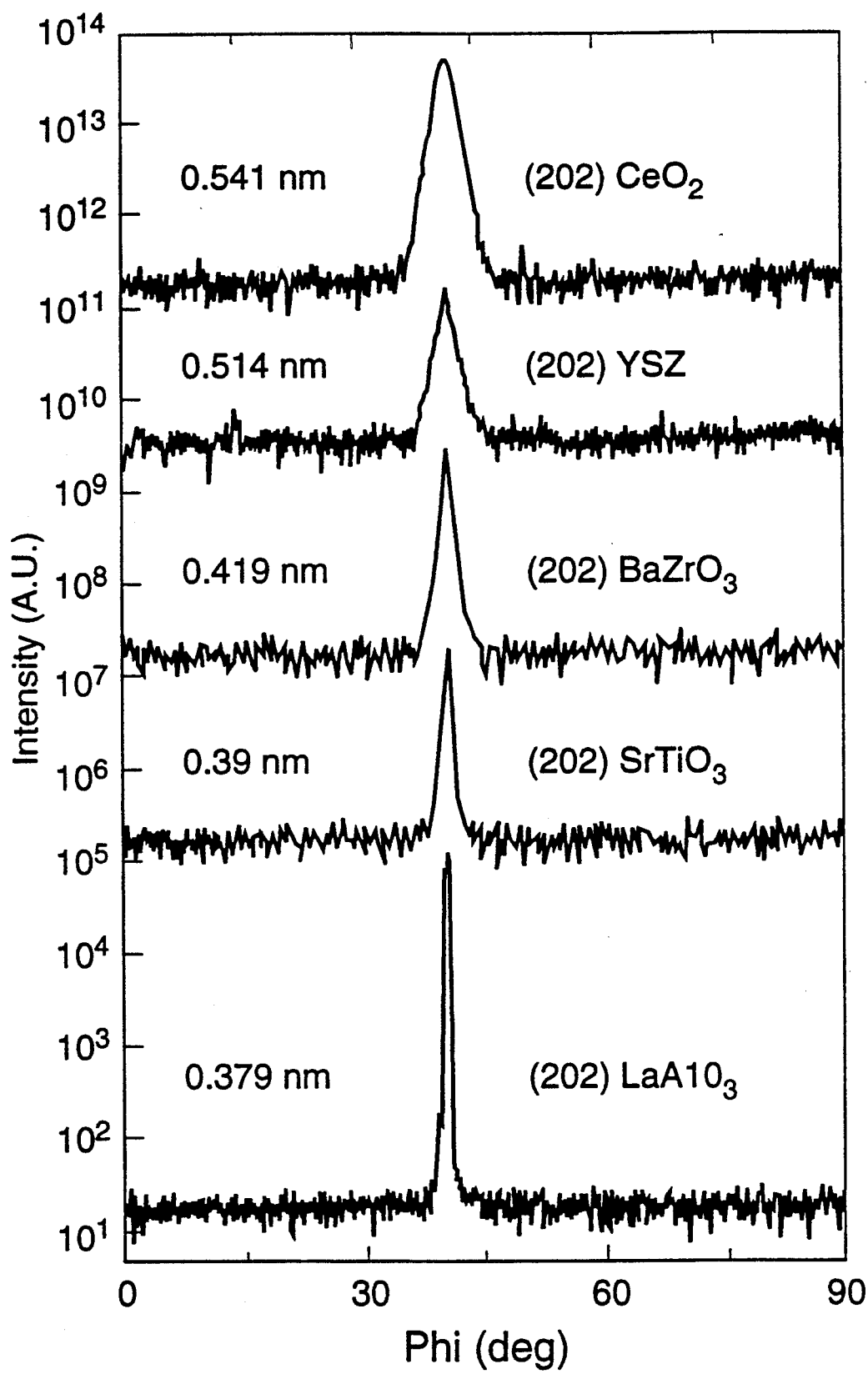
FIG. 2 is a graph of phi scan data from an x-ray pole figure scan of a sample of cerium oxide upon yttrium-stabilized zirconia upon barium-zirconium oxide upon strontium-titanium oxide upon lanthanum aluminum oxide.

An article was prepared by depositing a layer of strontium-titanium oxide upon a lanthanum-aluminum oxide base substrate to form an initial substrate. A layer of barium-zirconium oxide was first applied upon the strontium-titanium oxide, then a layer of yttria-stabilized zirconia was applied upon the barium-zirconium oxide, and finally a layer of cerium oxide was applied upon the yttria-stabilized zirconia. Each application was by pulsed laser deposition under conditions as described previously. The resultant article was analyzed by x-ray pole figure scan and the results are shown in FIG. 2. These results indicated that a single in-plane rotation was present within the cerium oxide layer in contrast to the prior art.

EXAMPLE 2

Figure 3:
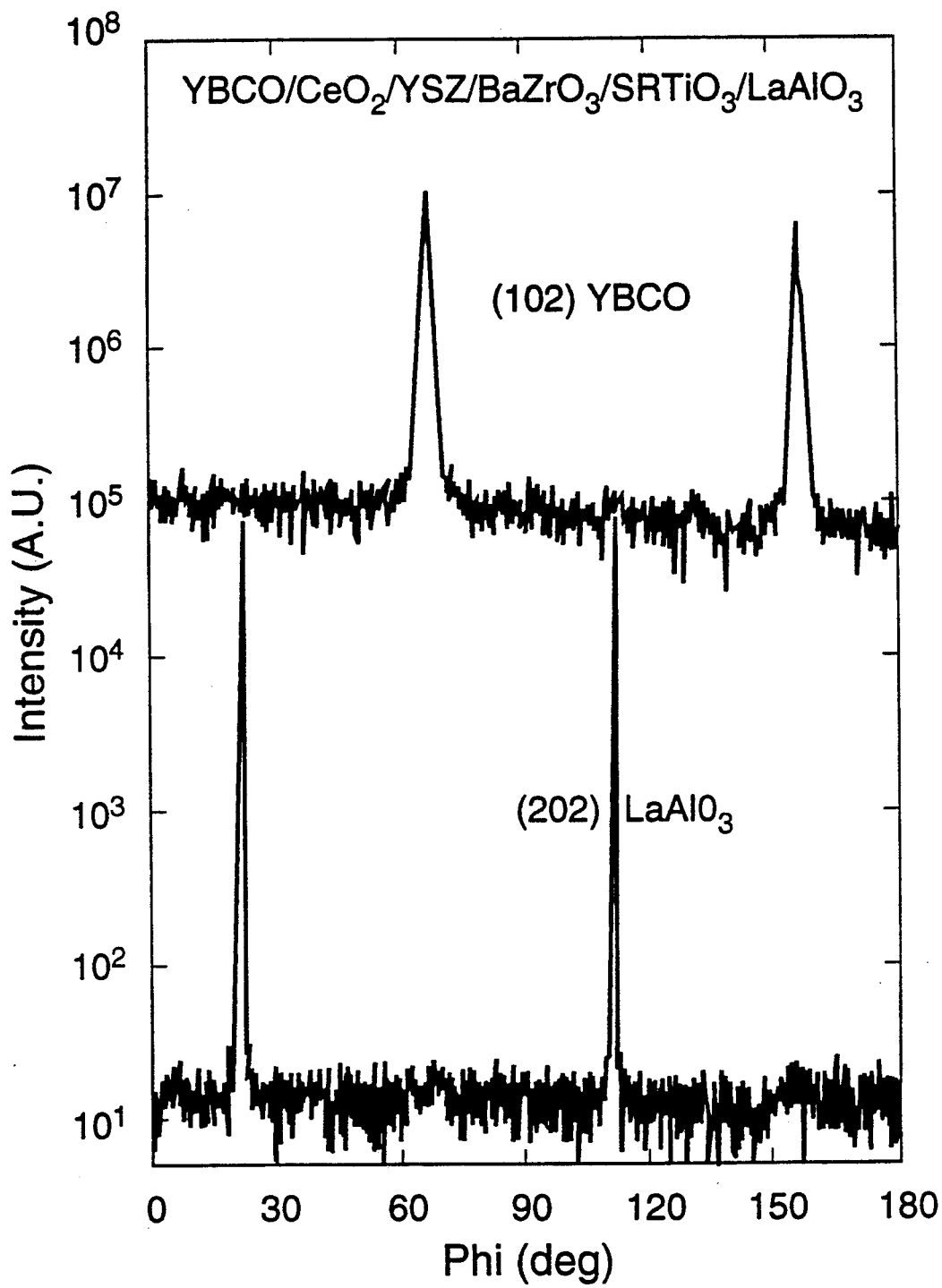
FIG. 3 is a graph of phi scan data from an x-ray pole figure scan of a sample of YBCO upon cerium oxide upon yttrium-stabilized zirconia (YSZ) upon barium-zirconium oxide upon strontium-titanium oxide upon lanthanum aluminum oxide.

An article was prepared as in example 1 and then a layer of YBCO superconductive material was applied upon the cerium oxide layer by pulsed laser deposition. The resultant article was analyzed by x-ray pole figure scan and the results are shown in FIG. 3. These results indicated that a single in-plane rotation was present within the YBCO layer and that the orientation of the YBCO was rotated approximately 45° with respect to the underlying layers such as lanthanum-aluminum oxide.

EXAMPLE 3

Figure 4:
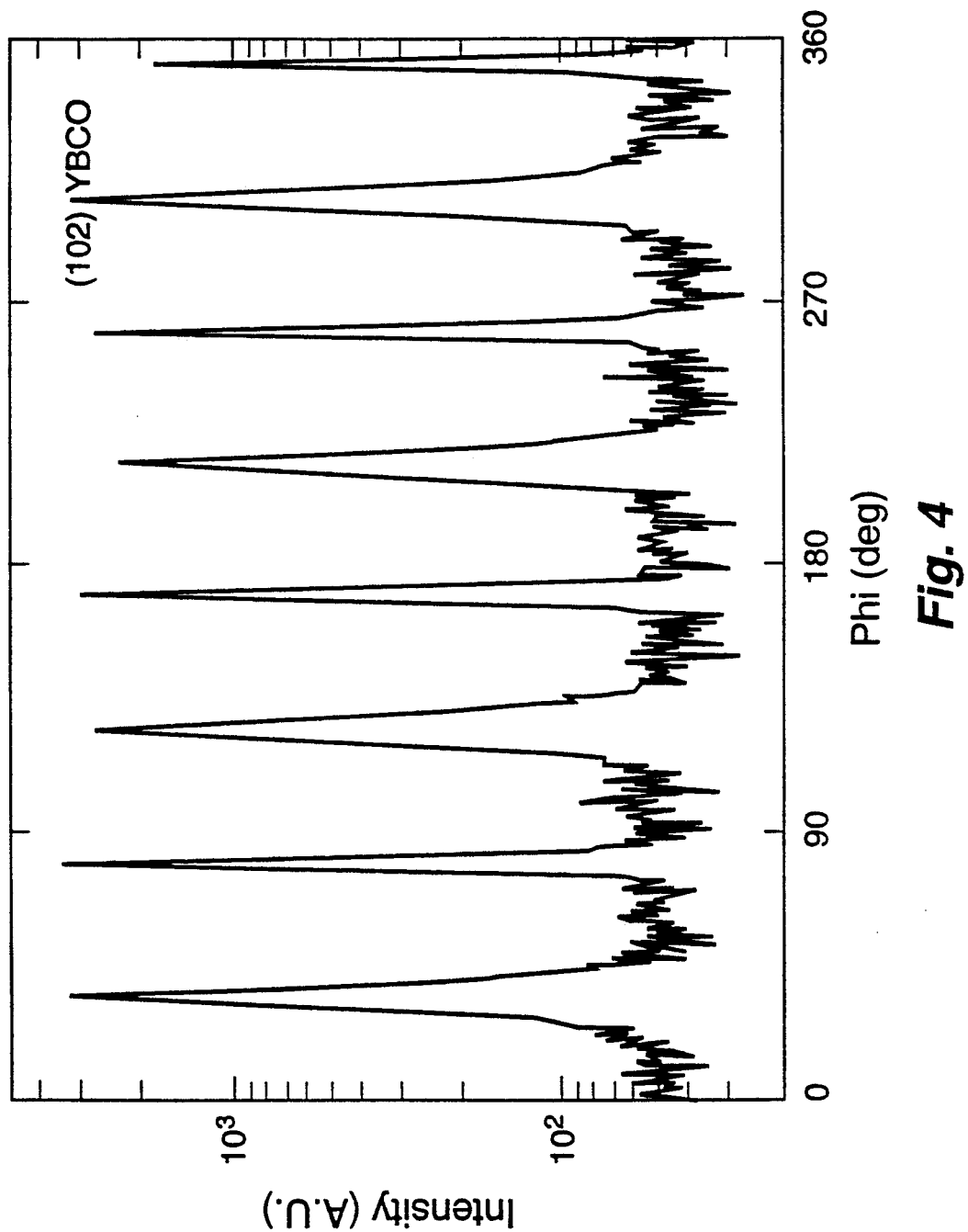
FIG. 4 is a graph of phi scan data from an x-ray pole figure scan of a sample of YBCO upon YSZ upon magnesium oxide.

An article was prepared by depositing a patterned layer of yttria-stabilized zirconia upon a magnesium oxide substrate. Each application was by pulsed laser deposition under conditions as described previously. Then, a layer of YBCO superconductive material was applied upon the exposed YSZ and magnesium oxide by pulsed laser deposition. The resultant article was analyzed by x-ray pole figure scan and the results are shown in FIG. 4. These results show broader peaks for the YBCO upon the YSZ and narrow peaks for the YBCO upon the magnesium oxide. These results show that a 45° rotation is present for the YBCO on YSZ with respect to the YBCO on MgO.

EXAMPLE 4

Figure 5:
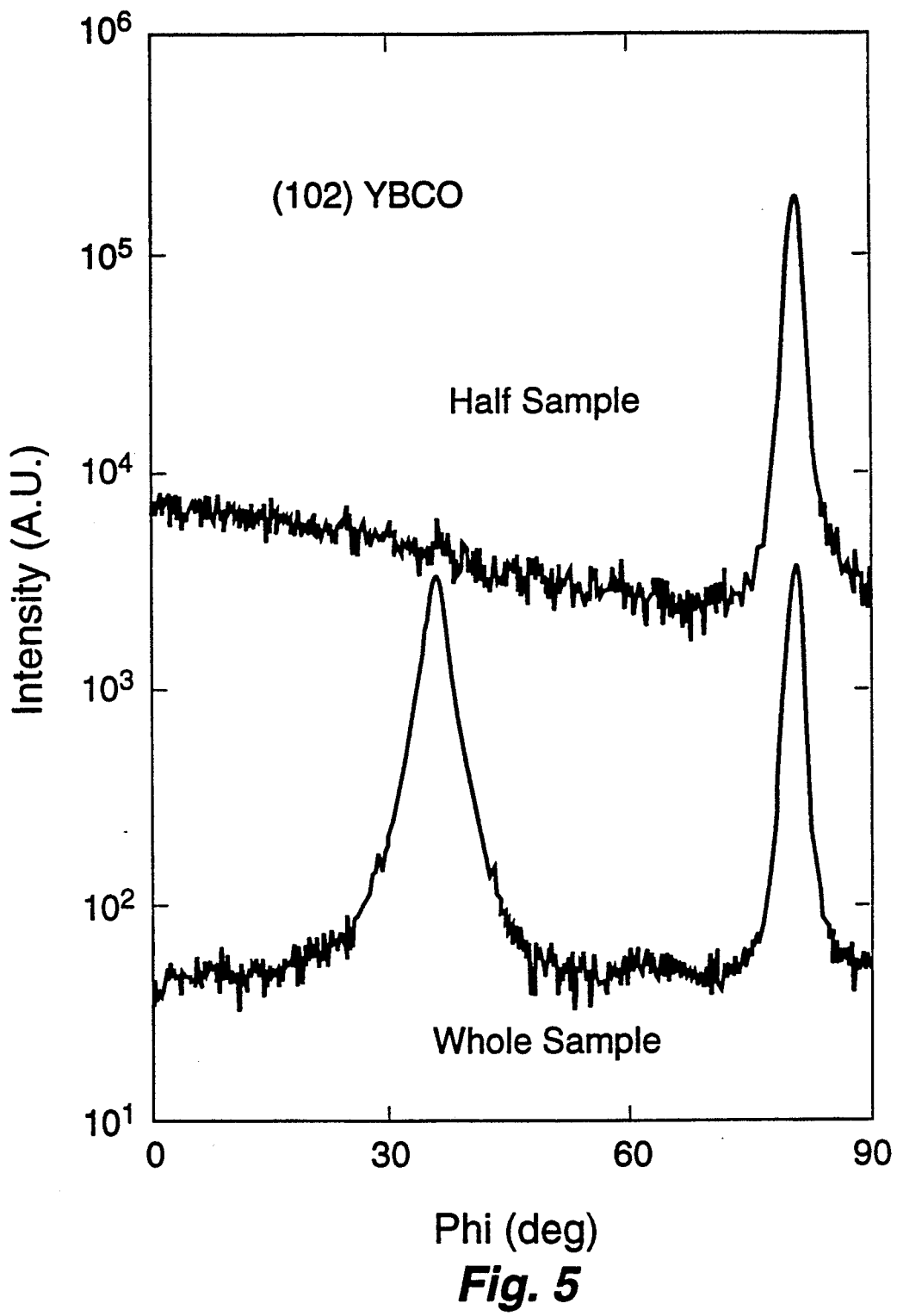
FIG. 5 is a graph of phi scan data from an x-ray pole figure scan of a partially masked sample of YBCO upon YSZ upon magnesium oxide.

An article was prepared as in example 3 except that a metal mask was placed over the YSZ layer. The resultant article was analyzed by x-ray pole figure scan and the results are shown in FIG. 5. These results for the half sample partially masked with the metal and for a whole sample from example 3 show that rotation is occuring over the YSZ layer as expected from previous data.

Although the present invention has been described with reference to specific details, it is not intended that such details should be regarded as limitations upon the scope of the invention, except as and to the extent that they are included in the accompanying claims.

What is claimed is:

1. An article of manufacture comprising:

a substrate;

a patterned interlayer of a material selected from the group consisting of magnesium oxide, barium-titanium oxide and barium-zirconium oxide upon the surface of the substrate thereby characterizable as an intermediate article having an exposed surface of both the patterned interlayer material and the substrate;

a secondary interlayer material of yttria-stabilized zirconia or magnesium-aluminum oxide overcoating the exposed surfaces of the patterned interlayer thereby characterizing a second intermediate article having an exposed surface of both the secondary interlayer material and the substrate;

a coating of a buffer layer selected from the group consisting of cerium oxide, curium oxide, dysprosium oxide, erbium oxide, eruopium oxide, iron oxide, gadolinium oxide, holmium oxide, indium oxide, manganese oxide, lanthanum oxide, lutetium oxide, neodymium oxide, praseodymium oxide, plutonium oxide, samarium oxide, terbium oxide, thallium oxide, thulium oxide, yttrium oxide and ytterbium oxide over at least the entire exposed surface of the secondary interlayer material; and, a ceramic high temperature superconductive material layer of a material selected from the group consisting of yttrium-barium-copper oxide, thallium-barium-calcium-copper oxide, neogymium-cerium-copper oxide and bismuth-potassium-barium oxide as an overcoat upon the buffer layer whereby the ceramic high temperature superconductive material situated directly above the substrate has a in-plane orientation of crystal structure substantially different than the ceramic high temperature superconductive material situated above the patterned interlayer material.

2. The article of claim 1 wherein the substrate is strontium-titanium oxide.

3. The article of claim 1 wherein the buffer layer is selected from the group consisting of cerium oxide, gadolinium oxide, yttrium oxide, praseodymium oxide and dysprosium oxide.

4. The article of claim 1 wherein the ceramic high temperature superconductive material is yttrium-barium-copper oxide.

5. The article of claim 1 wherein the coating of the buffer layer is directly over the entire exposed surface of the second intermediate article.

* * * * *